(12) United States Patent
Lee et al.

(10) Patent No.: US 8,437,191 B2
(45) Date of Patent: May 7, 2013

(54) FLASH MEMORY DEVICE AND OPERATING METHOD THEREOF

(75) Inventors: Jung-Hwan Lee, Gyeonggi-do (KR); Seong-Je Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 143 days.

(21) Appl. No.: 12/914,091

(22) Filed: Oct. 28, 2010

(65) Prior Publication Data

US 2012/0051135 A1 Mar. 1, 2012

(30) Foreign Application Priority Data

Aug. 30, 2010 (KR) .................. 10-2010-0083971

(51) Int. Cl.
*G11C 11/34* (2006.01)
(52) U.S. Cl.
USPC ...................................... 365/185.12; 365/203
(58) Field of Classification Search ............. 365/185.12, 365/203
See application file for complete search history.

(56) References Cited

U.S. PATENT DOCUMENTS

| 6,987,694 B2 * | 1/2006 | Lee ........................... 365/185.17 |
| 8,174,903 B2 * | 5/2012 | Han et al. ................. 365/185.25 |

FOREIGN PATENT DOCUMENTS

KR 1020070056667 6/2007

OTHER PUBLICATIONS

Notice of Allowance issued by the Korean Intellectual Property Office on May 29, 2012.

* cited by examiner

*Primary Examiner* — Son Dinh
*Assistant Examiner* — Nam Nguyen
(74) *Attorney, Agent, or Firm* — IP & T Group LLP

(57) ABSTRACT

A flash memory device includes a memory cell string including a plurality of memory cells serially coupled to one another between a bit line and a source line, a page buffer configured to perform a precharging operation and a sensing operation with respect to the bit line, and a power supply unit configured to supply a certain supply voltage through the source line before the precharging operation.

16 Claims, 6 Drawing Sheets

FLASH MEMORY DEVICE AND OPERATING METHOD THEREOF

CROSS-REFERENCE TO RELATED APPLICATIONS

The present application claims priority of Korean Patent Application No. 10-2010-0083971, filed on Aug. 30, 2010, which is incorporated herein by reference in its entirety.

BACKGROUND OF THE INVENTION

Exemplary embodiments of the present invention relate to a semiconductor design technology, and more particularly, to a flash memory device including a plurality of memory cells.

In general, a semiconductor memory device is classified into a volatile memory device, such as a dynamic random access memory (DRAM) or a static random access memory (SRAM), and a non-volatile memory device, such as a programmable read only memory (PROM), an erasable PROM (EPROM), an electrically erasable PROM (EEPROM) or a flash memory device. The biggest difference between the volatile memory device and the non-volatile memory device lies in whether data stored in a memory cell is preserved after a predetermined time passes. In the volatile memory device, the data stored in the memory cell is not preserved after the predetermined time passes. Meanwhile, in the non-volatile memory device, the data stored in the memory cell is preserved after the predetermined time passes. In this regard, the volatile memory device necessarily requires a refresh operation in order to preserve data. Meanwhile, the non-volatile memory device does not require the refresh operation. Since the non-volatile memory device is suitable for low power consumption and high integration, it has been extensively used as a data storage medium.

A flash memory device of the non-volatile memory device includes a plurality of memory cells for storing data, and the plurality of memory cells are serially coupled to one another to form one cell string.

In general, a flash memory device performs a program operation and an erase operation to store data in the memory cells. According to the program operation, electrons are accumulated in a floating gate of a transistor constituting a memory cell. According to the erase operation, the electrons accumulated in the floating gate are discharged to a substrate. The flash memory device stores data of '0' or '1' in the memory cell through the program operation and the erase operation, and senses the amount of the electrons accumulated in the floating gate at the time of a reading operation to determine data of '0' or '1' according to the sensing result.

As described above, data of '0' or '1' is stored in one memory cell. Because one bit data is stored in one memory cell, the memory cell is called a single level cell. Recently, memory cells which can store one or more bits of data have been developed. Such a memory cell is called a multi-level cell. The single level cell uses a single threshold voltage in order to determine data of '0' or '1' stored in the memory cell. On the other hand, the multi-level cell uses multiple threshold voltages in order to determine data (e.g., data of '00', '01', '10' and '11') stored in the memory cell.

FIG. 1 is a diagram illustrating the configuration of a general flash memory device.

Referring to FIG. 1, the flash memory device includes a memory cell block 110 having a plurality of cell strings ST, a source line driving unit 120, a page buffer 130, and an NMOS transistor NM. The source line driving unit 120 drives a common source line CSL by using a power supply voltage VDD or a ground supply voltage VSS according to an operation mode. The page buffer 130 performs a precharging operation and a data sensing operation with respect to a corresponding bit line BL. The NMOS transistor NM couples a bit line BL to the page buffer 130 in response to a bit line selection signal BL_SEL.

In general, the flash memory device applies a programming voltage to a plurality of word lines WL0 to WLn, thereby storing desired data in a corresponding memory cell. The programming voltage applied to the word lines WL0 to WLn is applied using an incremental step pulse program (ISPP) method. According to the ISPP method, a predetermined primary programming voltage is applied to a word line selected at the time of a program operation, and then a secondary programming voltage higher than the primary programming voltage is applied. More specifically, the ISPP method uses a stepped voltage level to adjust the programming voltage.

The program operation is accompanied by a verify operation. That is, the flash memory device performs the verify operation in the middle of the program operation to determine whether desired data is properly stored in a memory cell, and performs a read operation only after the desired data is stored in all memory cells.

Ideally, a bit line current I_BL flowing through a bit line BL at the time of the verify operation, through which it is determined that the desired data is stored in the memory cell, is about the same as a bit line current I_BL flowing through the bit line BL at the time of the read operation. However, in actuality, the bit line current I_BL at the time of the verify operation is different from the bit line current I_BL at the time of the read operation due to bouncing of the common source line CSL, back pattern dependency (BPD), interference, temperature and the like.

FIGS. 2 to 5 are diagrams illustrating a change in the bit line current I_BL illustrated in FIG. 1. The bit line selection signal BL_SEL has a voltage level corresponding to 'V1' at the time of the precharging operation and has a voltage level corresponding to 'V2' lower than 'V1' at the time of the verify operation and a writing operation. For convenience, the bit line current I_BL during the verify operation is illustrated as 'I_BL_VE' and the bit line current I_BL during the read operation is illustrated as 'I_BL_RD'.

FIG. 2 is a diagram illustrating variation in the bit line current I_BL_VE during the verify operation and variation in the bit line current I_BL_RD during the read operation in an ideal case. As it can be seen from FIG. 2, the variation in the bit line current I_BL_VE during the verify operation is about the same as the variation in the bit line current I_BL_RD during the read operation.

FIG. 3 is a diagram illustrating variation in the bit line current I_BL_VE during the verify operation and variation in the bit line current I_BL_RD during the read operation when reflecting the bouncing of the common source line CSL. As it can be seen from FIG. 3, the bit line current I_BL_RD during the read operation is higher than the bit line current I_BL_VE during the verify operation. FIG. 4 is a diagram illustrating variation in the bit line current I_BL_VE during the verify operation and variation in the bit line current I_BL_RD during the read operation when reflecting the bouncing of the common source line CSL and the BPD. As it can be seen from FIG. 4, the bit line current I_BL_RD during the read operation is lower than the bit line current I_BL_VE during the verify operation. FIG. 5 is a diagram illustrating variation in the bit line current I_BL_VE during the verify operation and variation in the bit line current I_BL_RD during the read operation when reflecting the interference. Similarly to FIG.

4, as it can be seen from FIG. 5, the bit line current I_BL_RD during the read operation is lower than the bit line current I_BL_VE during the verify operation.

The main reason for the phenomena illustrated in FIGS. 3 to 5 occur is that the amount of the current flowing through the common source line CSL varies depending on the state of data stored in a plurality of memory cells. In other words, when the read operation is performed with respect to two memory cells storing the same data by using the page buffer 130, a change occurs in the amount of the current sunk through the common source line CSL depending on the state of the data stored in the plurality of memory cells.

FIG. 6 is a waveform diagram illustrating a read operation waveform of the flash memory device illustrated in FIG. 1.

Referring to FIG. 6, the flash memory device performs the read operation after the verify operation is completed with respect to all memory cells. The read operation includes a precharging period T1 for precharging a bit line BL, an evaluation period T2 for evaluating the precharged bit line BL, and a sensing period T3 for sensing the voltage level of the bit line BL. In the evaluation period T2, a charge precharged on the bit line BL is sunk to a terminal of the ground supply voltage VSS through the common source line CSL. At this time, a second control signal CTR2 is activated.

As it can be seen from FIG. 6, a change occurs in the bit line current I_BL_RD during the read operation due to the reason explained in FIGS. 3 to 5. The change in the bit line current I_BL_RD during the read operation represents a change in the data distribution of memory cells. As a result, during the read operation, the page buffer 130 may not perform a sensing operation of desired data.

SUMMARY OF THE INVENTION

Exemplary embodiments of the present invention are directed to a flash memory device capable of performing a first precharging operation, which reflects the states of a plurality of memory cells, and a second precharging operation for precharging a bit line.

In accordance with an exemplary embodiment of the present invention, a flash memory device includes a memory cell string including a plurality of memory cells serially coupled to one another between a bit line and a source line, a page buffer configured to perform a precharging operation and a sensing operation with respect to the bit line, and a power supply unit configured to supply a certain supply voltage through the source line before the precharging operation.

The flash memory device may further include a source line driving unit which is configured to drive the source line by using a ground supply voltage during an evaluation operation of the bit line.

In accordance with another exemplary embodiment of the present invention, a flash memory device includes a memory cell string including a plurality of memory cells serially coupled to one another between a bit line and a source line, a page buffer configured to perform a precharging operation and a sensing operation with respect to the bit line, a power multiplexing driving unit configured to multiplex and output a supply voltage according to an operation period mode, and a power transmission unit configured to transmit an output voltage of the power multiplexing driving unit to the source line in response to an enable signal.

The enable signal may be activated in response to an activation of at least one of a plurality of control signals.

In accordance with yet another exemplary embodiment of the present invention, a method for operating a flash memory device includes primarily precharging a bit line to reflect states of a plurality of memory cells, secondarily precharging the bit line for a certain time period, after primarily precharging the bit line, evaluating the bit line, and sensing the bit line.

In the primarily precharging of the bit line, the bit line may be precharged by driving a source line coupled to the plurality of memory cells.

In accordance with the exemplary embodiments of the present invention, the flash memory device performs a first precharging operation reflecting the states of a plurality of memory cells and a second precharging operation for precharging a bit line, thereby controlling a bit line current to corresponding to certain data at the time of a sensing operation of a read operation.

DESCRIPTION OF SPECIFIC EMBODIMENTS

Figure 1:
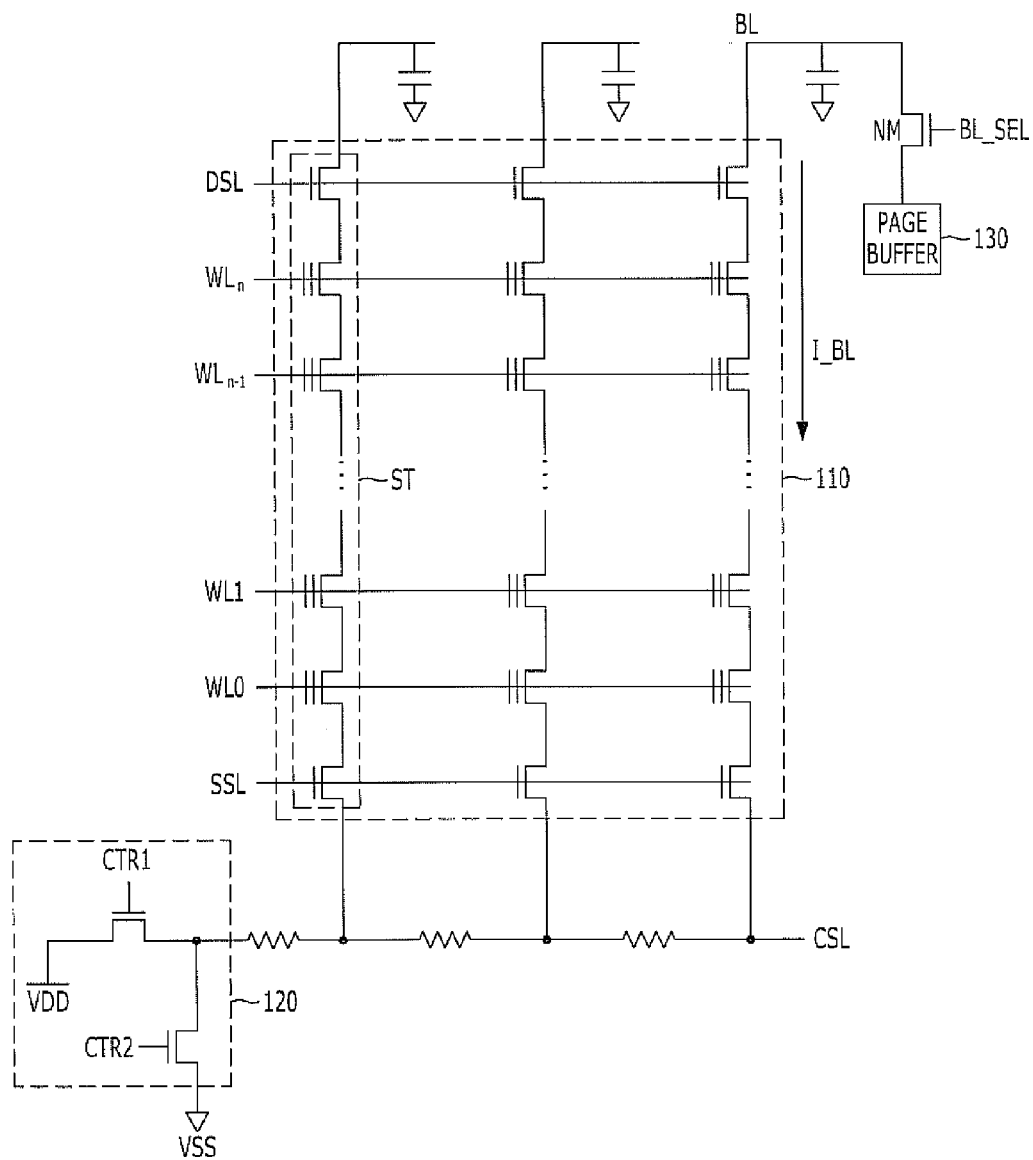
FIG. 1 is a diagram illustrating the configuration of a general flash memory device.
Figure 2:
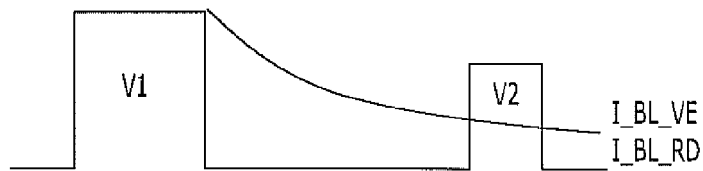
FIGS. 2 to 5 are diagrams illustrating a change in the bit line current I_BL illustrated in FIG. 1.
Figure 3:
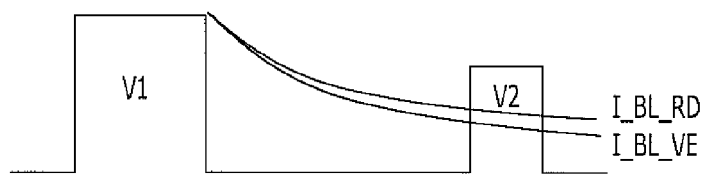
Figure 4:
Figure 5:
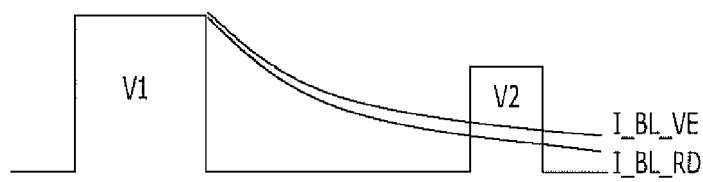
Figure 6:
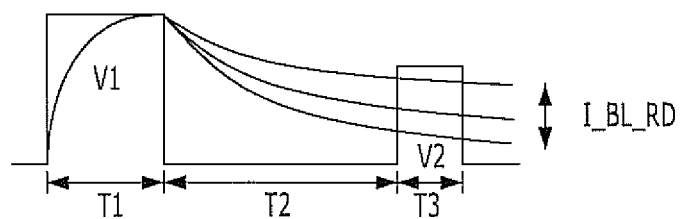
FIG. 6 is a waveform diagram illustrating a read operation waveform of the flash memory device illustrated in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 7:
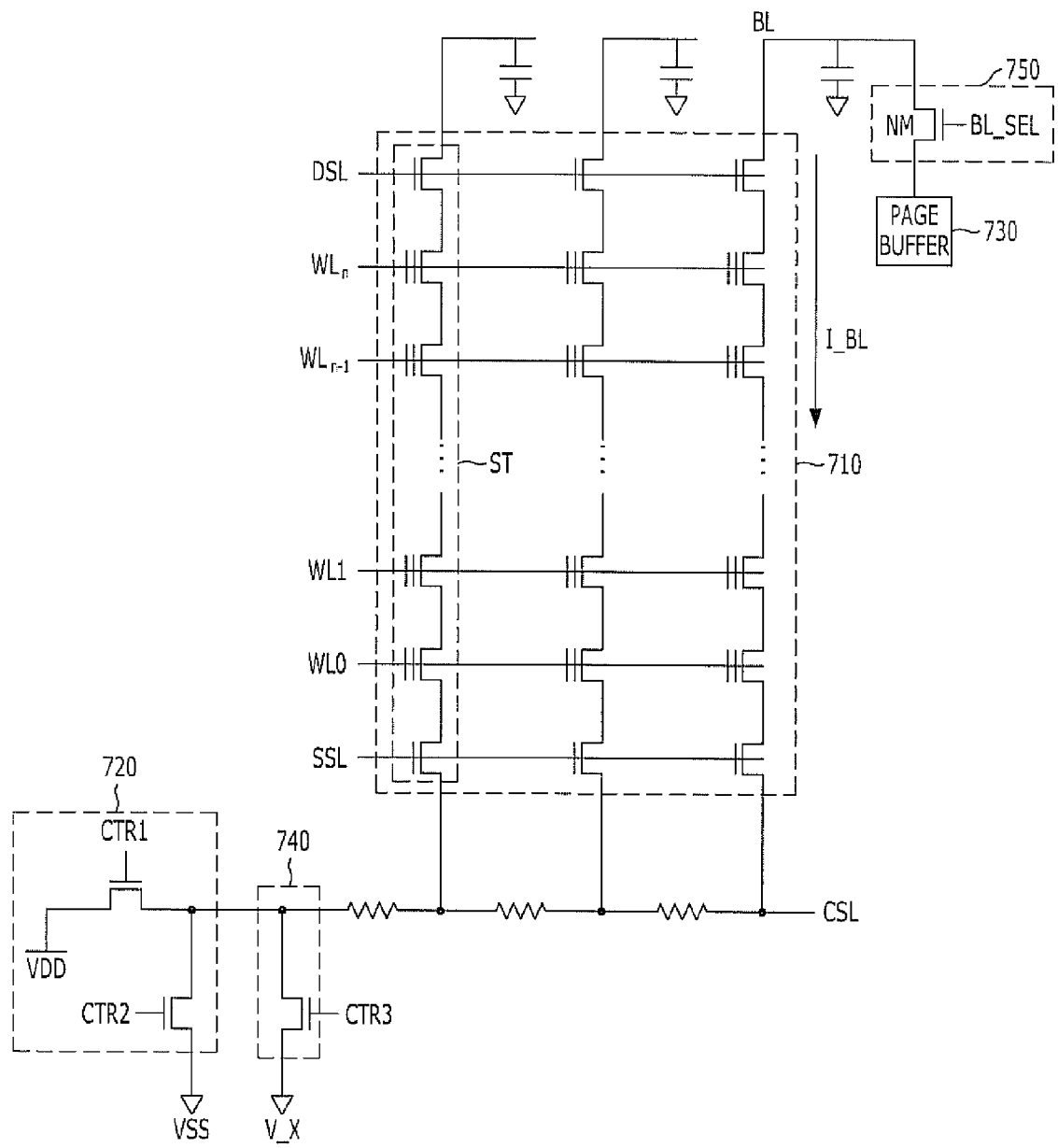
FIG. 7 is a diagram illustrating the configuration of a flash memory device in accordance with a first exemplary embodiment of the present invention.

FIG. 7 is a diagram illustrating the configuration of a flash memory device in accordance with a first exemplary embodiment of the present invention.

Referring to FIG. 7, the flash memory device includes a memory cell block 710 having a plurality of cell strings ST, a source line driving unit 720, a page buffer 730, and a bit line selection unit 750. The source line driving unit 720 is configured to drive a common source line CSL by using a power supply voltage VDD or a ground supply voltage VSS in response to first and second control signals CTR1 and CTR2 according to an operation mode. The page buffer 730 performs a precharging operation and a data sensing operation with respect to a corresponding bit line BL. The bit line selection unit 750 couples a bit line BL to the page buffer 730 in response to a bit line selection signal BL_SEL. As shown in FIG. 7, the bit line selection unit 750 may be an NMOS transistor NM. The cell strings ST include a plurality of memory cells, transistors for coupling the bit line BL to the plurality of memory cells in response to a drain selection signal DSL, and transistors for coupling the plurality of memory cells to the common source line CSL in response to a source selection signal SSL.

The flash memory device in accordance with the first exemplary embodiment of the present invention further includes a power supply unit 740 which is configured to supply a certain supply voltage V_X to the common source line CSL before the precharging operation of the bit line BL in response to a third control signal CTR3.

The power supply unit 740 may include a transistor having a source and a drain, which are connected between the common source line CSL and a terminal with the certain supply voltage V_X, and a gate, which receives the third control signal CTR3. When the power supply unit 740 is activated, the certain supply voltage V_X is applied to the common source line CSL. The power supply unit 740 may be activated, when the third control signal CTR3 turns-on a transistor. For example, where the power supply unit 740 includes an NMOS transistor, activating the third control signal CTR3 turns-on the NMOS transistor thereby supplying the certain supply voltage V_X to the common source line CSL. The activation periods of the third control signal CTR3 may be changed if necessary, and specifically, may correspond to the number of memory cells. That is, when the number of memory cells is relatively large, the activation periods of the third control signal CTR3 may be controlled to be relatively long. Meanwhile, when the number of memory cells is relatively small, the activation periods of the third control signal CTR3 may be controlled to be relatively short.

The flash memory device in accordance with the first exemplary embodiment of the present invention may perform a precharging operation (hereinafter, referred to as a 'first precharging operation') for reflecting the states of the memory cells in the bit line BL before performing a precharging operation (hereinafter, referred to as a 'second precharging operation') of an existing read operation, which is performed after data is programmed to all memory cells. That is, the power supply unit 740 is activated before the second precharging operation used to precharge the bit line BL during the read operation. Therefore, the power supply unit 740 drives the common source line CSL by using the certain supply voltage V_X prior to the second precharging operation. Consequently, the bit line BL is precharged with voltages corresponding to the plurality of memory cells through the first precharging operation. As a result, the states of the plurality of memory cells are reflected in the bit line BL through the first precharging operation.

Figure 8:
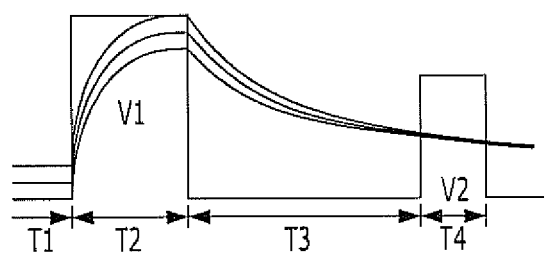
FIG. 8 is a waveform diagram illustrating a read operation waveform of the flash memory device illustrated in FIG. 7.

FIG. 8 is a waveform diagram illustrating a read operation waveform of the flash memory device illustrated in FIG. 7.

Referring to FIGS. 7 and 8, the flash memory device performs the read operation after the verify operation is completed with respect to all memory cells. The read operation in accordance with the first exemplary embodiment of the present invention includes a first precharging period T1 for precharging the bit line BL with the certain supply voltage V_X by using the power supply unit 740, a second precharging period T2 for precharging the bit line BL with a voltage level of 'V1', an evaluation period T3 for evaluating the precharged bit line BL, and a sensing period T4 for sensing the voltage level of the bit line BL.

In the first precharging period T1 in accordance with the first exemplary embodiment of the present invention, the drain selection signal DSL and the source selection signal SSL are activated and the third control signal CTR3 is provided to activate the power supply unit 740. Thus, the first precharging operation is performed corresponding to the states of the plurality of memory cells of the bit line BL. Since the second precharging period T2, the evaluation period T3, and the sensing period T4 are similar as those of the conventional art, a description thereof is omitted.

As it can be seen from FIG. 8, in the first precharging period T1, the first precharging level of the bit line BL may vary according to the states of the memory cells. Thus, a voltage level of the bit line BL may reach different levels as a result of the second precharging operation in the second precharging period T2. Therefore, the second precharging operation precharges the bit lines to account for the variation in the sinking currents of the evaluation period T3, which vary according to the states of the memory cells. As a result, in the sensing period T4, the bit line BL has the same voltage level regardless of the states of the memory cells. That is, at the time the memory cells are read, the bit line current has the same voltage level regardless of the states of the memory cells. Thus, the page buffer 730 receives correct data at the time of reading the memory cells in the sensing period T4 of the read operation.

In the first exemplary embodiment of the present invention illustrated in FIG. 7, the common source line CSL is precharged with only the certain supply voltage V_X in response to the third control signal CTR3. However, the common source line CSL may be precharged with a plurality of certain supply voltages having different voltage levels from one another.

Figure 9:
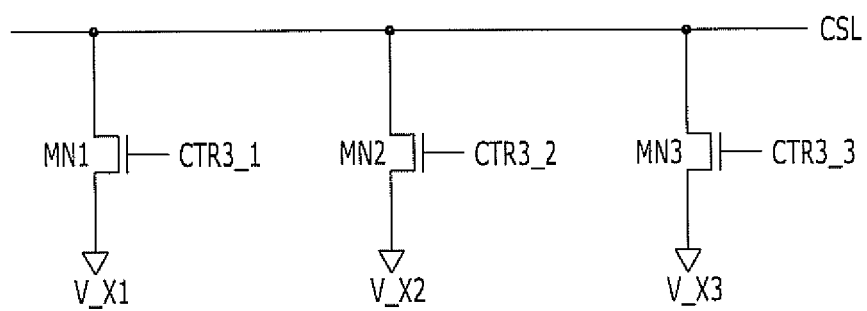
FIG. 9 is a circuit diagram illustrating a power supply in accordance with another exemplary embodiment.

FIG. 9 is a circuit diagram illustrating the power supply unit 740 illustrated in FIG. 7 in accordance with another exemplary embodiment.

Referring to FIG. 9, the power supply unit 740 includes a first NMOS transistor NM1, a second NMOS transistor NM2, and a third NMOS transistor NM3. The first NMOS transistor NM1 forms a source-drain path between the common source line CSL and a terminal having a first supply voltage V_X1, and receives a third control signal 'CTR3_1' through a gate thereof. The second NMOS transistor NM2 forms a source-drain path between the common source line CSL and a terminal having a second supply voltage V_X2, and receives a third control signal 'CTR3_2' through a gate thereof. The third NMOS transistor NM3 forms a source-drain path between the common source line CSL and a terminal having a third supply voltage V_X3, and receives a third control signal 'CTR3_3' through a gate thereof. The first to third supply voltages V_X1 to V_X3 have different voltage levels from one another.

The third control signals 'CTR3_1' to 'CTR3_3' may be activated during the evaluation period T3 (see FIG. 8) of the read operation. When one of the third control signals 'CTR3_1' to 'CTR3_3' is activated, a corresponding one of the first to third supply voltages V_X1 to V_X3 is applied to the common source line CSL. Further, any combination of the first to third supply voltages V_X1 to V_X3 may be applied at the same time.

The power supply unit 740 in accordance with another exemplary embodiment of the present invention is configured to multiplex a certain supply voltage, which is used for driving the common source line CSL, in response to the third control signals 'CTR3_1' to 'CTR3_3', thereby adjusting the voltage level of a supply voltage applied to the common source line CSL.

Figure 10:
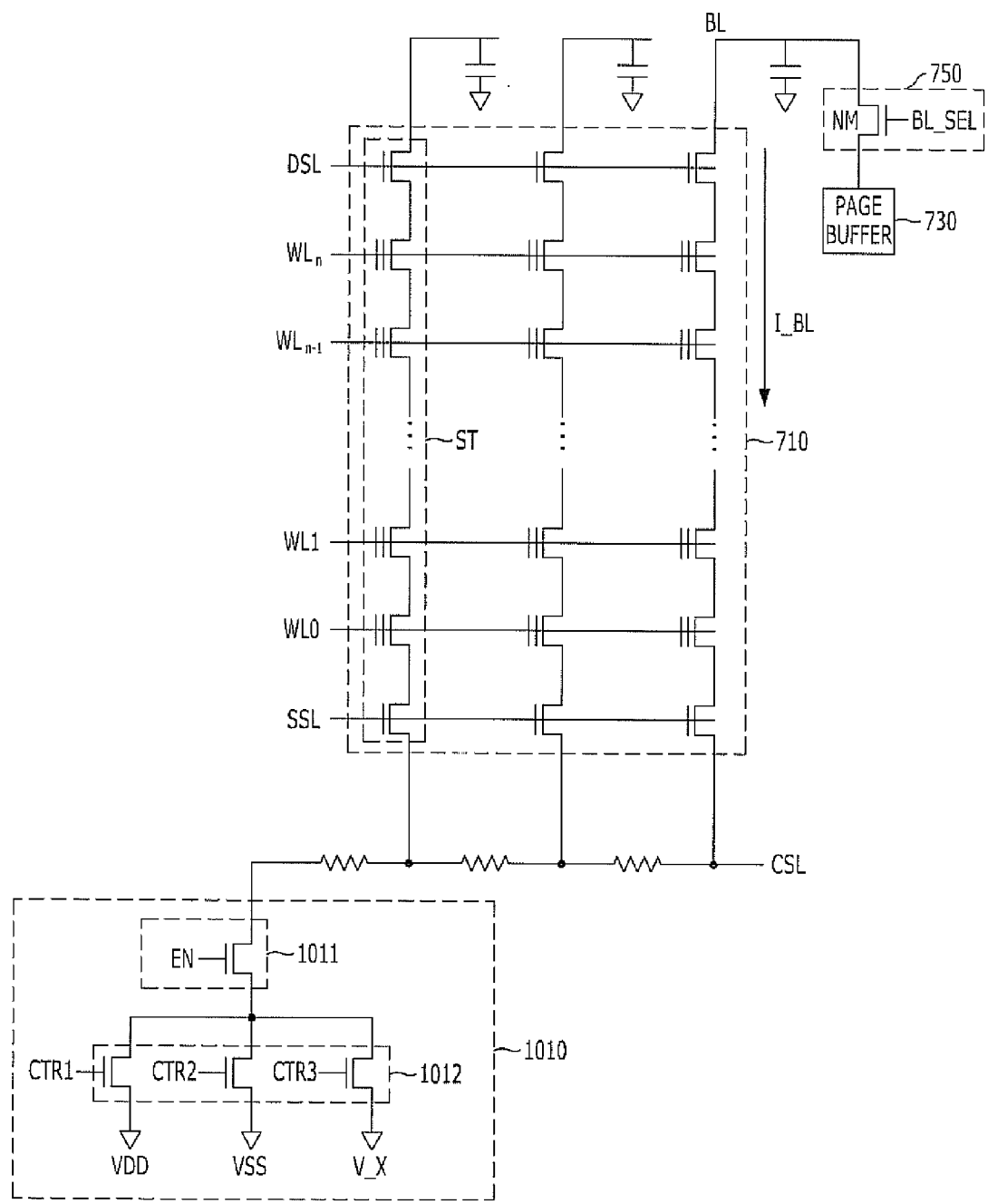
FIG. 10 is a diagram illustrating the configuration of a flash memory device in accordance with a second exemplary embodiment of the present invention.

FIG. 10 is a diagram illustrating the configuration of a flash memory device in accordance with a second exemplary embodiment of the present invention. The flash memory device in accordance with the second exemplary embodiment illustrated in FIG. 10 includes a power multiplexing driving unit 1010, instead of the source line driving unit 720 and the power supply unit 740 illustrated in FIG. 7.

Referring to FIG. 10, the power multiplexing driving unit 1010 includes a power transmission section 1011 and a power multiplexing section 1012 in order to drive the common source line CSL for various operation modes by using a corresponding supply voltage in response to an enable signal EN and first to third control signals CTR1 to CTR3.

The power transmission section 1011 is configured to transmit an output voltage of the power multiplexing section 1012 to the common source line CSL in response to the enable signal EN, and the power multiplexing section 1012 is configured to multiplex and selectively output a power supply voltage VDD, a ground supply voltage VSS, and a certain supply voltage VX in response to the first to third control signals CTR1 to CTR3. The enable signal EN turns on the power transmission section 1011 when the power multiplexing section 1012 outputs at least one of the powers supply voltage VDD, the ground supply voltage VSS, and the certain supply voltage V_X. For example, the enable signal EN may be activated when one of the first to third control signals CTR1 to CTR3 is activated.

Thus, the common source line CSL receives the power supply voltage VDD in response to the first control signal CRT1, receives the ground supply voltage VSS in response to the second control signal CRT2, and receives the certain supply voltage V_X in response to the third control signal CRT3. That is, according to the second exemplary embodiment, the same operation as that in the first exemplary embodiment may be performed.

In the configuration in accordance with the second exemplary embodiment of the present invention, loading reflected in the common source line CSL may be reduced. In FIG. 1, two NMOS transistors, in addition to the cell strings, are directly coupled to the common source line CSL. However, in the second exemplary embodiment illustrated in FIG. 10, one NMOS transistor is directly coupled to the common source line CSL. Thus, the loading reflected in the common source line CSL may be reduced.

As described above, the flash memory devices in accordance with the first and second exemplary embodiments of the present invention perform the first precharging operation to account for the states of a plurality of memory cells, before performing the second precharging operation for precharging the bit line BL, thereby precharging the bit line BL with voltage levels corresponding to the states of the plurality of memory cells. As a result, the precharged bit line BL has the same voltage level corresponding to programmed data in the sensing period regardless of the states of the memory cells. Therefore, the page buffer can accurately receive data programmed in the memory cells.

According to an exemplary embodiment of the present invention, a bit line current, corresponding to certain data, is always the same at the time of sensing the data, so that a current amount accurately reflecting data stored in memory cells may be accurately sensed.

While the present invention has been described with respect to the specific embodiments, it will be apparent to those skilled in the art that various changes and modifications may be made without departing from the spirit and scope of the invention as defined in the following claims.

What is claimed is:

1. A flash memory device comprising:
   a memory cell string including a plurality of memory cells serially coupled to one another between a bit line and a source line;
   a page buffer configured to perform a precharging operation and a sensing operation with respect to the bit line; and
   a power supply unit configured to supply a certain supply voltage through the source line before the precharging operation,
   wherein the certain supply voltage is different from a ground supply voltage.

2. The flash memory device of claim 1, further comprising a source line driving unit which is configured to drive the source line by using the ground supply voltage during an evaluation operation of the bit line.

3. The flash memory device of claim 1, wherein the power supply unit is configured to receive the certain supply voltage, and apply the certain supply voltage to the source line in response to a control signal.

4. The flash memory device of claim 3, wherein the control signal is activated before the precharging operation and has an activation period corresponding to a number of the plurality of memory cells.

5. The flash memory device of claim 4, wherein the activation period of the control signal increases as the number of the plurality of memory cells increases.

6. The flash memory device of claim 1, wherein the power supply unit is configured to apply a plurality of certain supply voltages with different voltage levels from one another to the source line in response to a plurality of control signals.

7. The flash memory device of claim 6, wherein at least one of the plurality of control signals is activated before the precharging operation, and has an activation period corresponding to a number of the plurality of memory cells.

8. The flash memory device of claim 1, wherein the memory cell string further comprises:
   a first coupling section configured to couple the bit line to the plurality of memory cells in response to a first selection signal; and
   a second coupling section configured to couple the plurality of memory cells to the source line in response to a second selection signal.

9. The flash memory device of claim 8, wherein the first selection signal and the second selection signal are activated before the precharging operation.

10. A method for operating a flash memory device, comprising:
    primarily precharging a bit line to reflect states of a plurality of memory cells by supplying a certain supply voltage to a source line, wherein the certain supply voltage is different from a ground supply voltage;
    secondarily precharging the bit line for a certain time period, after primarily precharging the bit line;
    evaluating the bit line; and
    sensing the bit line.

11. The method of claim 10, wherein the primarily precharging of the bit line is performed after a verify operation is completed.

12. The method of claim 10, wherein, the primarily precharging of the bit line is performed by driving the source line coupled to the plurality of memory cells.

13. The method of claim 10, wherein the primarily precharging of the bit line is performed by driving the bit line with the certain supply voltage for a certain time period.

14. The method of claim 10, wherein the primarily precharging of the bit line is performed for a time period corresponding to a number of the plurality of memory cells.

15. The method of claim 14, wherein the time period of the primarily precharging of the bit line increases as the number of the plurality of memory cells increases.

16. The method of claim 10, wherein, the primarily precharging of the bit line is performed by driving the bit line with at least one of a plurality of supply voltages in response to a plurality of control signals.

* * * * *